(12) United States Patent
Guo et al.

(10) Patent No.: US 11,184,714 B2
(45) Date of Patent: Nov. 23, 2021

(54) HEARING DEVICE COMPRISING A LOOP GAIN LIMITER

(71) Applicant: Oticon A/S, Smørum (DK)

(72) Inventors: Meng Guo, Smørum (DK); Bernhard Kuenzle, Berne (CH); Martin Kuriger, Berne (CH)

(73) Assignee: OTICON A/S, Smørum (DK)

( * ) Notice: Subject to any disclaimer, the term of this patent is extended or adjusted under 35 U.S.C. 154(b) by 0 days.

(21) Appl. No.: 16/801,832

(22) Filed: Feb. 26, 2020

(65) Prior Publication Data

US 2020/0275217 A1 Aug. 27, 2020

(30) Foreign Application Priority Data

Feb. 27, 2019 (EP) ..................................... 19159572

(51) Int. Cl.
*H04R 25/00* (2006.01)
*H03G 3/30* (2006.01)

(52) U.S. Cl.
CPC ......... *H04R 25/505* (2013.01); *H03G 3/3005* (2013.01); *H04R 25/453* (2013.01); *H04R 2225/43* (2013.01)

(58) Field of Classification Search
CPC .. H04R 25/505; H03G 3/3005; H03G 25/453; H03G 225/43
See application file for complete search history.

(56) References Cited

U.S. PATENT DOCUMENTS

| 2004/0136557 | A1  | 7/2004 | Kaulberg |
|---|---|---|---|
| 2005/0047620 | A1* | 3/2005 | Fretz .................... H04R 25/453 381/318 |

(Continued)

FOREIGN PATENT DOCUMENTS

EP 3 062 531 A1 8/2016

*Primary Examiner* — Sunita Joshi
(74) *Attorney, Agent, or Firm* — Birch, Stewart, Kolasch & Birch, LLP

(57) ABSTRACT

A hearing device comprises an input transducer providing an input gain $G_I$, a signal processor comprising a compressor for determining a frequency and level dependent desired compressor gain $G_P$ to compensate for a hearing impairment of the user, and to provide a resulting compressor gain $G'_P$, and an output transducer for providing output stimuli perceivable as sound for the user based on a processed signal, the output transducer providing an output gain, $G_O$. A resulting forward path gain G' is defined in a logarithmic representation as $G_I+G'_P+G_O$. The hearing device further comprises a loop gain estimator for continuously estimating a current loop gain ΔL(n), configured to provide a loop gain estimate within a predefined number of feedback loop delays after a feedback buildup has started, and a loop gain controller for dynamically controlling said resulting forward path gain G' in dependence of said estimate of said current loop gain ΔL(n). A resulting loop gain, LG', is determined as a sum of the resulting forward path gain G' and a feedback gain H when given in a logarithmic representation. The loop gain controller is configured to provide that the resulting loop gain is limited to stay below a predefined value.

20 Claims, 9 Drawing Sheets

(56) References Cited

U.S. PATENT DOCUMENTS

2009/0067654 A1    3/2009  Klinkby et al.
2011/0311075 A1*  12/2011  Elmedyb .............. H04R 25/353
                                                                               381/94.2
2013/0170660 A1*  7/2013  Kristensen ............. H04R 25/30
                                                                               381/60

\* cited by examiner

HEARING DEVICE COMPRISING A LOOP GAIN LIMITER

SUMMARY

The loop gain plays an important role during a feedback build-up and feedback control. A very high loop gain (such as +20 dB) leads to an ultra-fast build-up (20 dB per feedback loop, typically within a few ms), the feedback howl appears extremely quickly, and it is very challenging for a feedback control system to reduce the feedback artefacts.

A feedback system is typically designed for (being able to handle) a maximum loop gain (LGmax), e.g., in the range LG<6 dB. If the loop gain gets much larger than the maximum loop gain, the system faces a situation that was not designed for. It is likely that the feedback control fails. A very large loop gain typically occurs for a short time during an abrupt feedback path change (e.g. moving a phone to the ear) where the adaptive feedback control system is too slow to react.

A loop gain limiter is proposed for keeping the actual loop gain below a predefined value even in the most extreme situations. In order to do so it should preferably estimate and reduce the current loop gain extremely quickly, typically within the time corresponding to 1-2 feedback loops (loop delays). This speed requirement rules out traditional correlation-based loop gain measures and a novel measure is proposed, which may be solely based on the signal level. The loop gain limiter ensures that the feedback control system operates within its designed loop gain range.

A Hearing Device:

In an aspect of the present application, a hearing device, e.g. a hearing aid, configured to be worn by a user at or in an ear (or for being fully or partially implanted in the head (e.g. at an ear) of the user) is provided. The hearing device comprises
- a forward path comprising
  - an input transducer for providing an electric input signal representing sound in the environment of the hearing device, the input transducer providing an input gain GI,
  - a signal processor for processing said electric input signal or a signal based thereon and providing a processed signal, the signal processor comprising a compressor for determining a frequency and level dependent desired compressor gain GP to compensate for a hearing impairment of the user, and to provide a resulting compressor gain G'P,
  - an output transducer for providing output stimuli perceivable as sound for the user based on said processed signal, the output transducer providing an output gain, GO.

A resulting forward path gain G' is defined in a logarithmic representation as GI+G'P+GO. The hearing device may further comprise a loop gain limiter comprising
- a loop gain estimator for continuously estimating a current loop gain $\Delta L(n)$, configured to provide a loop gain estimate within a predefined number of feedback loops, preferably within less than three feedback loops (loop delays), after a feedback buildup has started. The loop gain estimate may e.g. be calculated as the current level of a signal of the forward path at time index n minus the level of the same signal one feedback loop (loop delay) earlier, and
- a loop gain controller for dynamically controlling said resulting forward path gain G' in dependence of said estimate of said current loop gain $\Delta L(n)$.

An acoustic feedback path is defined from the output transducer to the input transducer. The feedback path exhibits a feedback gain H. A resulting loop gain, LG', may be determined as a sum of the resulting forward path gain G' and the feedback gain H when given in a logarithmic representation. The loop gain controller may be configured to provide that the resulting loop gain is limited to stay below a predefined value.

Thereby an improved hearing device may be provided.

The loop gain controller provides a control signal for modifying the gain of the signal processor (SPU) from the desired processor gain $G_P$ to the resulting processor gain $G'_P$ to thereby provide a resulting loop gain LG' for the hearing device. The signal processor (or the loop gain controller) may comprise a feedback estimation unit. The feedback estimation unit may be configured to estimate feedback path (e.g. a feedback gain $H_{est}$) from the output transducer to the input transducer and to provide a signal $FBP_{est}$ representative of such estimate. The signal processor may comprise a feedback control system comprising a feedback estimation unit and a combination unit for subtracting the estimate of the feedback from the electric input signal to thereby provide a feedback corrected input signal. The estimate of the feedback path may be available to the loop gain controller and/or to the loop gain estimator.

A feedback buildup is assumed to have started when the input signal gets dominated by acoustic feedback, i.e. when the acoustic feedback signal becomes louder than the acoustic signal from the environment. A feedback buildup may be assumed to have started, when said estimate of current loop gain $\Delta L(n)$ is larger than or equal to a maximum loop gain value LGmax.

The exact start of the feedback buildup is not known, so the loop gain estimator will continuously provide values that may potentially result in unnecessary gain reductions in the forward path. However, as soon as a feedback buildup has started, the loop gain estimator shall provide a useful (sufficiently precise) loop gain estimate within less than a few (e.g. three) feedback loops (loop delays), resulting in an effective loop gain limitation.

The loop gain controller may be configured to decrease said resulting forward path gain G' in case said estimate of said current loop gain $\Delta L(n)$ is larger than or equal to a maximum loop gain value LGmax. Thereby the resulting loop gain LG' is reduced compared to the original loop gain LG (without the loop gain limiter).

The hearing device may be configured to estimate the current loop gain $\Delta L(n)$ in a number of frequency bands K, where K is larger than one. K may e.g. be larger than or equal to four, e.g. larger than or equal to sixteen or twenty-four.

The maximum value LGmax of loop gain may be smaller than or equal to 3 dB, such as smaller than or equal to 2 dB, such as smaller than or equal to 1 dB, such as smaller than or equal to 0 dB.

The loop gain estimator may be configured to estimate said current loop gain $\Delta L(n)$ based only on information about the signal level. In other words, only the signal level, not the signal phase, is used to estimate current loop gain $\Delta L(n)$.

The loop gain estimator may be configured to estimate said current loop gain $\Delta L(n)$ as $\Delta L(n) = L(n) - L(n-n_D)$, where $L(n)$ is the signal level in dB of a signal of the forward path at the time index n, and $L(n-n_D)$ is the signal level of the same signal one feedback loop earlier, where $n_D$ is defined by a loop delay D of said feedback loop. The estimate of loop gain may thus be solely based on level estimation.

The loop gain estimator may be configured to estimate a current loop gain $\Delta L(n)$ within a predefined time, e.g. within less than or equal to five, or less than or equal to three feedback loops, such as within two feedback loops, such as within one feedback loop, after a feedback buildup has started.

The loop gain estimator may comprise a level estimator for estimating a current level of the electric input signal or another signal of the forward path of the hearing device. The level estimator may be configured to operate in a number of frequency bands K, where K is larger than one, such as larger than or equal to four, e.g. larger than or equal to 16.

The loop gain controller may be configured to determine said resulting gain G' according to the following expression $$G'(n) = G(n) - \Delta G(n)$$

where $\Delta G(n)$ is the gain reduction at a given point in time n, wherein the gain reduction is larger than or equal to 0 dB.

The loop gain controller may be configured to determine said resulting gain G' according to the following expression $$G'(n) = G - \max\left(\frac{\Delta L(n) - LG\max}{a}, 0\right)$$

where the parameter a is used to control the degree of loop gain limitation, and LGmax is a maximum acceptable value of loop gain before gain reduction is initiated. The maximum acceptable value of loop gain may be predetermined (e.g. equal to 0 dB) or dynamically determined during use of the hearing device, e.g. in dependence of an estimate of the feedback path, e.g. at a number of frequencies (or frequency bands).

The hearing device may be configured to smooth the resulting forward path gain G' over time to provide a smoothed resulting gain G*. The hearing device may comprise a smoothing unit for smoothing the resulting forward path gain G' over time according to the following expression $$G^*(n) = \beta \cdot G'(n) + (1-\beta) \cdot G^*(n-1)$$

where $\beta$ is a positive parameter. The smoothing unit may be implemented as a smoothing filter, e.g. as a first order IIR filter, where $\beta$ is the filter coefficient, and $\beta$ is positive and close to 0, e.g. equal to 0.1 or smaller.

The loop gain estimator may be configured to provide a corrected current loop gain estimate $\Delta L'(n) = \Delta L(n) + \Delta G(n-1)$, wherein $\Delta G(n-1) = G(n-1) - G'(n-1)$ is the gain reduction one loop delay prior to the current time n, and wherein the loop gain controller is configured to determine said resulting gain G'(n) based on the corrected current loop gain estimate $\Delta L'(n)$. Thereby the gain reduction G' can be improved to avoid gain (and loop gain) jumps.

The loop gain estimator may be configured to multiply the gain reduction $\Delta G(n-1)$ one loop delay prior to the current time n with a leaking factor $\gamma$, where $\gamma$ is smaller than 1. Thereby constant gain reduction in special signal conditions can be avoided (ensures that the loop gain controller is not 'locked' to a constant gain reduction).

The signal processor comprises a combination unit configured to apply said resulting processor gain $G'_P$ to said electric input signal or to a signal originating therefrom. Thereby the processed signal may be provided.

The loop gain controller for dynamically controlling said resulting forward path gain G' may be configured to apply a gain reduction $\Delta G$, only if the estimated loop gain is within a given range, e.g. 6-20 dB.

The compressor may e.g. be configured to propose a requested gain for a current input signal from a hearing profile of the user, e.g. based on an audiogram and a fitting rationale for the given hearing aid style. The compressor may e.g. be configured to translate a level of an electric input signal to an appropriate gain (e.g. amplification or attenuation) in dependence of frequency and level of the input signal in question. The compressor is configured to compensate for a hearing impairment of the user.

The hearing device may be constituted by or comprise a hearing aid.

The hearing device may be adapted to provide a frequency dependent gain and/or a level dependent compression and/or a transposition (with or without frequency compression) of one or more frequency ranges to one or more other frequency ranges, e.g. to compensate for a hearing impairment of a user. The hearing device may comprise a signal processor for processing the input signals and providing a processed output signal.

The hearing device may comprise an output unit for providing a stimulus perceived by the user as an acoustic signal based on a processed electric signal. The output unit may comprise an output transducer. The output transducer may comprise a receiver (loudspeaker) for providing the stimulus as an acoustic signal to the user (e.g. in an acoustic (air conduction based) hearing device). The output transducer may comprise a vibrator for providing the stimulus as mechanical vibration of a skull bone to the user (e.g. in a bone-attached or bone-anchored hearing device). The output unit, e.g. the output transducer may comprise a digital to analogue (DA) converter, and possibly a synthesis filter bank, as appropriate for the application.

The hearing device may comprise an input unit for providing an electric input signal representing sound. The input unit may comprise an input transducer, e.g. a microphone, for converting an input sound to an electric input signal. The input unit may comprise a wireless receiver for receiving a wireless signal comprising sound and for providing an electric input signal representing said sound. The input unit, such as the input transducer may include appropriate analogue to digital (AD) converters, and possibly analysis filter banks, as appropriate for the application.

The hearing device may comprise a directional microphone system adapted to spatially filter sounds from the environment, and thereby enhance a target acoustic source among a multitude of acoustic sources in the local environment of the user wearing the hearing device. The directional system may be adapted to detect (such as adaptively detect) from which direction a particular part of the microphone signal originates. This can be achieved in various different ways as e.g. described in the prior art. In hearing devices, a microphone array beamformer is often used for spatially attenuating background noise sources. Many beamformer variants can be found in literature. The minimum variance distortionless response (MVDR) beamformer is widely used in microphone array signal processing. Ideally the MVDR beamformer keeps the signals from the target direction (also referred to as the look direction) unchanged, while attenuating sound signals from other directions maximally. The generalized sidelobe canceller (GSC) structure is an equivalent representation of the MVDR beamformer offering computational and numerical advantages over a direct implementation in its original form.

The hearing device may be or form part of a portable device, e.g. a device comprising a local energy source, e.g. a battery, e.g. a rechargeable battery.

The hearing device may comprise a forward or signal path between an input unit (e.g. an input transducer, such as a microphone or a microphone system and/or direct electric input (e.g. a wireless receiver)) and an output unit, e.g. an output transducer. The signal processor may be located in the forward path. The signal processor may be adapted to provide a frequency dependent gain according to a user's particular needs. The hearing device may comprise an analysis path comprising functional components for analyzing the input signal (e.g. determining a level, a modulation, a type of signal, an acoustic feedback estimate, etc.). The hearing device may comprise one or more filter banks allowing that some or all signal processing of the analysis path and/or the signal path may be conducted in the frequency domain. Alternatively, some or all signal processing of the analysis path and/or the signal path may be conducted in the time domain.

An analogue electric signal representing an acoustic signal may be converted to a digital audio signal in an analogue-to-digital (AD) conversion process, where the analogue signal is sampled with a predefined sampling frequency or rate $f_s$, $f_s$ being e.g. in the range from 8 kHz to 48 kHz (adapted to the particular needs of the application) to provide digital samples $x_n$ (or x[n]) at discrete points in time $t_n$ (or n), each audio sample representing the value of the acoustic signal at $t_n$ by a predefined number $N_b$ of bits, $N_b$ being e.g. in the range from 1 to 48 bits, e.g. 24 bits. Each audio sample is hence quantized using $N_b$ bits (resulting in $2^{Nb}$ different possible values of the audio sample). A digital sample x has a length in time of $1/f_s$, e.g. 50 µs, for $f_s=20$ kHz. a number of audio samples may be arranged in a time frame. A time frame my comprise 64 or 128 audio data samples. Other frame lengths may be used depending on the practical application.

The hearing device may comprise an analogue-to-digital (AD) converter to digitize an analogue input (e.g. from an input transducer, such as a microphone) with a predefined sampling rate, e.g. 20 kHz. The hearing device may comprise a digital-to-analogue (DA) converter to convert a digital signal to an analogue output signal, e.g. for being presented to a user via an output transducer.

The hearing device, e.g. the input unit, and or the antenna and transceiver circuitry may comprise a TF-conversion unit for providing a time-frequency representation of an input signal. The time-frequency representation may comprise an array or map of corresponding complex or real values of the signal in question in a particular time and frequency range. The TF conversion unit may comprise a filter bank for filtering a (time varying) input signal and providing a number of (time varying) output signals each comprising a distinct frequency range of the input signal. The TF conversion unit may comprise a Fourier transformation unit for converting a time variant input signal to a (time variant) signal in the (time-)frequency domain. The frequency range considered by the hearing device may extend from a minimum frequency $f_{min}$ to a maximum frequency $f_{max}$ and comprise a part of the typical human audible frequency range from 20 Hz to 20 kHz, e.g. a part of the range from 20 Hz to 12 kHz. Typically, a sample rate $f_s$ is larger than or equal to twice the maximum frequency $f_{max}$, $f_s \geq 2f_{max}$. A signal of the forward and/or analysis path of the hearing device may be split into a number NI of frequency bands (e.g. of uniform width), where NI is e.g. larger than 5, such as larger than 10, such as larger than 50, such as larger than 100, such as larger than 500, at least some of which are processed individually. The hearing device may be adapted to process a signal of the forward and/or analysis path in a number NP of different frequency channels (NP≤NI). The frequency channels may be uniform or non-uniform in width (e.g. increasing in width with frequency), overlapping or non-overlapping.

The hearing device may comprise a number of detectors configured to provide status signals relating to a current physical environment of the hearing device (e.g. the current acoustic environment), and/or to a current state of the user wearing the hearing device, and/or to a current state or mode of operation of the hearing device. Alternatively or additionally, one or more detectors may form part of an external device in communication (e.g. wirelessly) with the hearing device. An external device may e.g. comprise another hearing device, a remote control, and audio delivery device, a telephone (e.g. a smartphone), an external sensor, etc.

One or more of the number of detectors may operate on the full band signal (time domain) One or more of the number of detectors may operate on band split signals ((time-) frequency domain), e.g. in a limited number of frequency bands.

The number of detectors may comprise a level detector (=level estimator) for estimating a current level of a signal of the forward path. The predefined criterion may comprise whether the current level of a signal of the forward path is above or below a given (L−)threshold value. The level detector may operate on the full band signal (time domain). The level detector may operate on band split signals ((time-) frequency domain)

The hearing device may comprise a voice detector (VD) for estimating whether or not (or with what probability) an input signal comprises a voice signal (at a given point in time). A voice signal is in the present context taken to include a speech signal from a human being. It may also include other forms of utterances generated by the human speech system (e.g. singing). The voice detector unit is adapted to classify a current acoustic environment of the user as a VOICE or NO-VOICE environment. This has the advantage that time segments of the electric microphone signal comprising human utterances (e.g. speech) in the user's environment can be identified, and thus separated from time segments only (or mainly) comprising other sound sources (e.g. artificially generated noise). The voice detector may be adapted to detect as a VOICE also the user's own voice. Alternatively, the voice detector may be adapted to exclude a user's own voice from the detection of a VOICE.

The hearing device may comprise an own voice detector for estimating whether or not (or with what probability) a given input sound (e.g. a voice, e.g. speech) originates from the voice of the user of the system. A microphone system of the hearing device may be adapted to be able to differentiate between a user's own voice and another person's voice and possibly from NON-voice sounds.

The number of detectors may comprise a movement detector, e.g. an acceleration sensor. In an embodiment, the movement detector is configured to detect movement of the user's facial muscles and/or bones, e.g. due to speech or chewing (e.g. jaw movement) and to provide a detector signal indicative thereof.

The hearing device may comprise a classification unit configured to classify the current situation based on input signals from (at least some of) the detectors, and possibly other inputs as well. In the present context 'a current situation' is taken to be defined by one or more of a) the physical environment (e.g. including the current electromagnetic environment, e.g. the occurrence of electromagnetic signals (e.g. comprising audio and/or control signals) intended or not intended for reception by the hearing device, or other properties of the current environment than acoustic);

b) the current acoustic situation (input level, feedback, etc.), and c) the current mode or state of the user (movement, temperature, cognitive load, etc.);

d) the current mode or state of the hearing device (program selected, time elapsed since last user interaction, etc.) and/or of another device in communication with the hearing device.

The hearing device may comprise an acoustic (and/or mechanical) feedback suppression system. Acoustic feedback occurs because the output loudspeaker signal from an audio system providing amplification of a signal picked up by a microphone is partly returned to the microphone via an acoustic coupling through the air or other media. The part of the loudspeaker signal returned to the microphone is then re-amplified by the system before it is re-presented at the loudspeaker, and again returned to the microphone. As this cycle continues, the effect of acoustic feedback becomes audible as artifacts or even worse, howling, when the system becomes unstable. The problem appears typically when the microphone and the loudspeaker are placed closely together, as e.g. in hearing aids or other audio systems. Some other classic situations with feedback problem are telephony, public address systems, headsets, audio conference systems, etc. Adaptive feedback cancellation has the ability to track feedback path changes over time. It is based on a linear time invariant filter to estimate the feedback path but its filter weights are updated over time. The filter update may be calculated using stochastic gradient algorithms, including some form of the Least Mean Square (LMS) or the Normalized LMS (NLMS) algorithms. They both have the property to minimize the error signal in the mean square sense with the NLMS additionally normalizing the filter update with respect to the squared Euclidean norm of some reference signal.

The feedback suppression system may comprise a feedback estimation unit for providing a feedback signal representative of an estimate of the acoustic feedback path, and a combination unit, e.g. a subtraction unit, for subtracting the feedback signal from a signal of the forward path (e.g. as picked up by an input transducer of the hearing device). The feedback estimation unit may comprise an update part comprising an adaptive algorithm and a variable filter part for filtering an input signal according to variable filter coefficients determined by said adaptive algorithm, wherein the update part is configured to update said filter coefficients of the variable filter part with a configurable update frequency $f_{upd}$.

The update part of the adaptive filter comprises an adaptive algorithm for calculating updated filter coefficients for being transferred to the variable filter part of the adaptive filter. The timing of the update (e.g. its specific point in time, and/or its update frequency) may preferably be influenced by various properties of the signal of the forward path. The update control scheme is preferably supported by one or more detectors of the hearing device, preferably included in a predefined criterion comprising the detector signals.

The hearing device may further comprise other relevant functionality for the application in question, e.g. compression, noise reduction, etc.

The hearing device may comprise a listening device, e.g. a hearing aid, e.g. a hearing instrument, e.g. a hearing instrument adapted for being located at the ear or fully or partially in the ear canal of a user, e.g. a headset, an earphone, an ear protection device or a combination thereof. In an embodiment, the hearing assistance system comprises a speakerphone (comprising a number of input transducers and a number of output transducers, e.g. for use in an audio conference situation), e.g. comprising a beamformer filtering unit, e.g. providing multiple beamforming capabilities.

Use:

In an aspect, use of a hearing device as described above, in the 'detailed description of embodiments' and in the claims, is moreover provided. In an embodiment, use is provided in a system comprising audio distribution, e.g. a system comprising a microphone and a loudspeaker in sufficiently close proximity of each other to cause feedback from the loudspeaker to the microphone during operation by a user. In an embodiment, use is provided in a system comprising one or more hearing aids (e.g. hearing instruments), headsets, ear phones, active ear protection systems, etc., e.g. in handsfree telephone systems, teleconferencing systems (e.g. including a speakerphone), public address systems, karaoke systems, classroom amplification systems, etc.

A Method:

In an aspect, a method of operating a hearing device, e.g. a hearing aid, configured to be worn by a user at or in an ear (or for being fully or partially implanted in the head (e.g. at an ear) of the user), is furthermore provided. The method comprises providing an electric input signal representing sound in the environment of the hearing device, thereby providing an input gain GI, processing said electric input signal, or a signal based thereon, and providing a processed signal, thereby determining a frequency and level dependent desired compressor gain GP to compensate for a hearing impairment of the user, and a resulting compressor gain G'P, providing output stimuli perceivable as sound for the user based on said processed signal, thereby providing an output gain, GO, a resulting forward path gain G' being defined in a logarithmic representation as GI+G'$_P$+GO, continuously estimating a current loop gain ΔL(n), configured to provide a loop gain estimate within a predefined number of feedback loop delays after a feedback buildup has started, wherein the loop gain estimate is calculated as the current level of a signal of the forward path at time index n minus the level of the same signal one feedback loop earlier, dynamically controlling said resulting forward path gain G' in dependence of said estimate of said current loop gain ΔL(n).

limiting a resulting loop gain, LG', defined as a sum of the resulting forward path gain G' and the feedback gain H when given in a logarithmic representation, where H is the feedback gain exhibited by the feedback path from an output transducer to an input transducer of the hearing device.

It is intended that some or all of the structural features of the device described above, in the 'detailed description of embodiments' or in the claims can be combined with embodiments of the method, when appropriately substituted by a corresponding process and vice versa. Embodiments of the method have the same advantages as the corresponding devices.

A Computer Readable Medium:

In an aspect, a tangible computer-readable medium storing a computer program comprising program code means for causing a data processing system to perform at least some (such as a majority or all) of the steps of the method described above, in the 'detailed description of embodiments' and in the claims, when said computer program is executed on the data processing system is furthermore provided by the present application.

By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media. In addition to being stored on a tangible medium, the computer program can also be transmitted via a transmission medium such as a wired or wireless link or a network, e.g. the Internet, and loaded into a data processing system for being executed at a location different from that of the tangible medium.

A Computer Program:

A computer program (product) comprising instructions which, when the program is executed by a computer, cause the computer to carry out (steps of) the method described above, in the 'detailed description of embodiments' and in the claims is furthermore provided by the present application.

A Data Processing System:

In an aspect, a data processing system comprising a processor and program code means for causing the processor to perform at least some (such as a majority or all) of the steps of the method described above, in the 'detailed description of embodiments' and in the claims is furthermore provided by the present application.

A Hearing System:

In a further aspect, a hearing system comprising a hearing device as described above, in the 'detailed description of embodiments', and in the claims, AND an auxiliary device is moreover provided.

In an embodiment, the hearing system is adapted to establish a communication link between the hearing device and the auxiliary device to provide that information (e.g. control and status signals, possibly audio signals) can be exchanged or forwarded from one to the other.

In an embodiment, the hearing system comprises an auxiliary device, e.g. a remote control, a smartphone, or other portable or wearable electronic device, such as a smartwatch or the like.

In an embodiment, the auxiliary device is or comprises a remote control for controlling functionality and operation of the hearing device(s). In an embodiment, the function of a remote control is implemented in a smartphone, the smartphone possibly running an APP allowing to control the functionality of the audio processing device via the smartphone (the hearing device(s) comprising an appropriate wireless interface to the smartphone, e.g. based on Bluetooth or some other standardized or proprietary scheme).

In an embodiment, the auxiliary device is or comprises an audio gateway device adapted for receiving a multitude of audio signals (e.g. from an entertainment device, e.g. a TV or a music player, a telephone apparatus, e.g. a mobile telephone or a computer, e.g. a PC) and adapted for selecting and/or combining an appropriate one of the received audio signals (or combination of signals) for transmission to the hearing device.

In an embodiment, the auxiliary device is or comprises another hearing device. In an embodiment, the hearing system comprises two hearing devices adapted to implement a binaural hearing system, e.g. a binaural hearing aid system.

An APP:

In a further aspect, a non-transitory application, termed an APP, is furthermore provided by the present disclosure. The APP comprises executable instructions configured to be executed on an auxiliary device to implement a user interface for a hearing device or a hearing system described above in the 'detailed description of embodiments', and in the claims. In an embodiment, the APP is configured to run on cellular phone, e.g. a smartphone, or on another portable device allowing communication with said hearing device or said hearing system.

Definitions

In the present context, a 'hearing device' refers to a device, such as a hearing aid, e.g. a hearing instrument, or an active ear-protection device, or other audio processing device, which is adapted to improve, augment and/or protect the hearing capability of a user by receiving acoustic signals from the user's surroundings, generating corresponding audio signals, possibly modifying the audio signals and providing the possibly modified audio signals as audible signals to at least one of the user's ears. A 'hearing device' further refers to a device such as an earphone or a headset adapted to receive audio signals electronically, possibly modifying the audio signals and providing the possibly modified audio signals as audible signals to at least one of the user's ears. Such audible signals may e.g. be provided in the form of acoustic signals radiated into the user's outer ears, acoustic signals transferred as mechanical vibrations to the user's inner ears through the bone structure of the user's head and/or through parts of the middle ear as well as electric signals transferred directly or indirectly to the cochlear nerve of the user.

The hearing device may be configured to be worn in any known way, e.g. as a unit arranged behind the ear with a tube leading radiated acoustic signals into the ear canal or with an output transducer, e.g. a loudspeaker, arranged close to or in the ear canal, as a unit entirely or partly arranged in the pinna and/or in the ear canal, as a unit, e.g. a vibrator, attached to a fixture implanted into the skull bone, as an attachable, or entirely or partly implanted, unit, etc. The hearing device may comprise a single unit or several units communicating electronically with each other. The loudspeaker may be arranged in a housing together with other components of the hearing device, or may be an external unit in itself (possibly in combination with a flexible guiding element, e.g. a dome-like element).

More generally, a hearing device comprises an input transducer for receiving an acoustic signal from a user's surroundings and providing a corresponding input audio signal and/or a receiver for electronically (i.e. wired or wirelessly) receiving an input audio signal, a (typically configurable) signal processing circuit (e.g. a signal processor, e.g. comprising a configurable (programmable) processor, e.g. a digital signal processor) for processing the input audio signal and an output unit for providing an audible signal to the user in dependence on the processed audio signal. The signal processor may be adapted to process the input signal in the time domain or in a number of frequency bands. In some hearing devices, an amplifier and/or compressor may constitute the signal processing circuit. The signal processing circuit typically comprises one or more (integrated or separate) memory elements for executing programs and/or for storing parameters used (or potentially used) in the processing and/or for storing information relevant for the function of the hearing device and/or for storing information (e.g. processed information, e.g. provided by the signal processing circuit), e.g. for use in connection with an interface to a user and/or an interface to a programming device. In some hearing devices, the output unit may comprise an output transducer, such as e.g. a loudspeaker for providing an air-borne acoustic signal or a vibrator for providing a structure-borne or liquid-borne acoustic signal. In some hearing devices, the output unit may comprise one or more output electrodes for providing electric signals (e.g. a multi-electrode array for electrically stimulating the cochlear nerve). In an embodiment, the hearing device comprises a speakerphone (comprising a number of input transducers and a number of output transducers, e.g. for use in an audio conference situation).

In some hearing devices, the vibrator may be adapted to provide a structure-borne acoustic signal transcutaneously or percutaneously to the skull bone. In some hearing devices, the vibrator may be implanted in the middle ear and/or in the inner ear. In some hearing devices, the vibrator may be adapted to provide a structure-borne acoustic signal to a middle-ear bone and/or to the cochlea. In some hearing devices, the vibrator may be adapted to provide a liquid-borne acoustic signal to the cochlear liquid, e.g. through the oval window. In some hearing devices, the output electrodes may be implanted in the cochlea or on the inside of the skull bone and may be adapted to provide the electric signals to the hair cells of the cochlea, to one or more hearing nerves, to the auditory brainstem, to the auditory midbrain, to the auditory cortex and/or to other parts of the cerebral cortex.

A hearing device, e.g. a hearing aid, may be adapted to a particular user's needs, e.g. a hearing impairment. A configurable signal processing circuit of the hearing device may be adapted to apply a frequency and level dependent compressive amplification of an input signal. A customized frequency and level dependent gain (amplification or compression) may be determined in a fitting process by a fitting system based on a user's hearing data, e.g. an audiogram, using a fitting rationale (e.g. adapted to speech). The frequency and level dependent gain may e.g. be embodied in processing parameters, e.g. uploaded to the hearing device via an interface to a programming device (fitting system), and used by a processing algorithm executed by the configurable signal processing circuit of the hearing device.

A 'hearing system' refers to a system comprising one or two hearing devices, and a 'binaural hearing system' refers to a system comprising two hearing devices and being adapted to cooperatively provide audible signals to both of the user's ears. Hearing systems or binaural hearing systems may further comprise one or more 'auxiliary devices', which communicate with the hearing device(s) and affect and/or benefit from the function of the hearing device(s). Auxiliary devices may be e.g. remote controls, audio gateway devices, mobile phones (e.g. smartphones), or music players. Hearing devices, hearing systems or binaural hearing systems may e.g. be used for compensating for a hearing-impaired person's loss of hearing capability, augmenting or protecting a normal-hearing person's hearing capability and/or conveying electronic audio signals to a person. Hearing devices or hearing systems may e.g. form part of or interact with public-address systems, active ear protection systems, handsfree telephone systems, car audio systems, entertainment (e.g. karaoke) systems, teleconferencing systems, classroom amplification systems, etc.

Embodiments of the disclosure may e.g. be useful in applications such as hearing aids.

BRIEF DESCRIPTION OF DRAWINGS

The aspects of the disclosure may be best understood from the following detailed description taken in conjunction with the accompanying figures. The figures are schematic and simplified for clarity, and they just show details to improve the understanding of the claims, while other details are left out. Throughout, the same reference numerals are used for identical or corresponding parts. The individual features of each aspect may each be combined with any or all features of the other aspects. These and other aspects, features and/or technical effect will be apparent from and elucidated with reference to the illustrations described hereinafter in which:

The figures are schematic and simplified for clarity, and they just show details which are essential to the understanding of the disclosure, while other details are left out. Throughout, the same reference signs are used for identical or corresponding parts.

Further scope of applicability of the present disclosure will become apparent from the detailed description given hereinafter. However, it should be understood that the detailed description and specific examples, while indicating preferred embodiments of the disclosure, are given by way of illustration only. Other embodiments may become apparent to those skilled in the art from the following detailed description.

DETAILED DESCRIPTION OF EMBODIMENTS

The detailed description set forth below in connection with the appended drawings is intended as a description of various configurations. The detailed description includes specific details for the purpose of providing a thorough understanding of various concepts. However, it will be apparent to those skilled in the art that these concepts may be practiced without these specific details. Several aspects of the apparatus and methods are described by various blocks, functional units, modules, components, circuits, steps, processes, algorithms, etc. (collectively referred to as "elements"). Depending upon particular application, design constraints or other reasons, these elements may be implemented using electronic hardware, computer program, or any combination thereof.

The electronic hardware may include microprocessors, microcontrollers, digital signal processors (DSPs), field programmable gate arrays (FPGAs), programmable logic devices (PLDs), gated logic, discrete hardware circuits, and other suitable hardware configured to perform the various functionality described throughout this disclosure. Computer program shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The present application relates to the field of hearing devices, e.g. hearing aids, in particular to feedback control using a loop gain limiter.

The loop gain limiter is used to limit the maximum loop gain for each feedback loop, when the feedback is building up, i.e. loop gain ≥0 dB.

This limitation can help the feedback control system, e.g. a feedback cancellation system, using adaptive filters, to better handle the up-building feedback/howl.

It has no (negative) effect on the feedback control system when the loop gain is not critical.

When the loop gain is positive, the signal level increases for each loop. The loop gain limiter may e.g. limit the (average) slope of this increase.

Figure 1A:
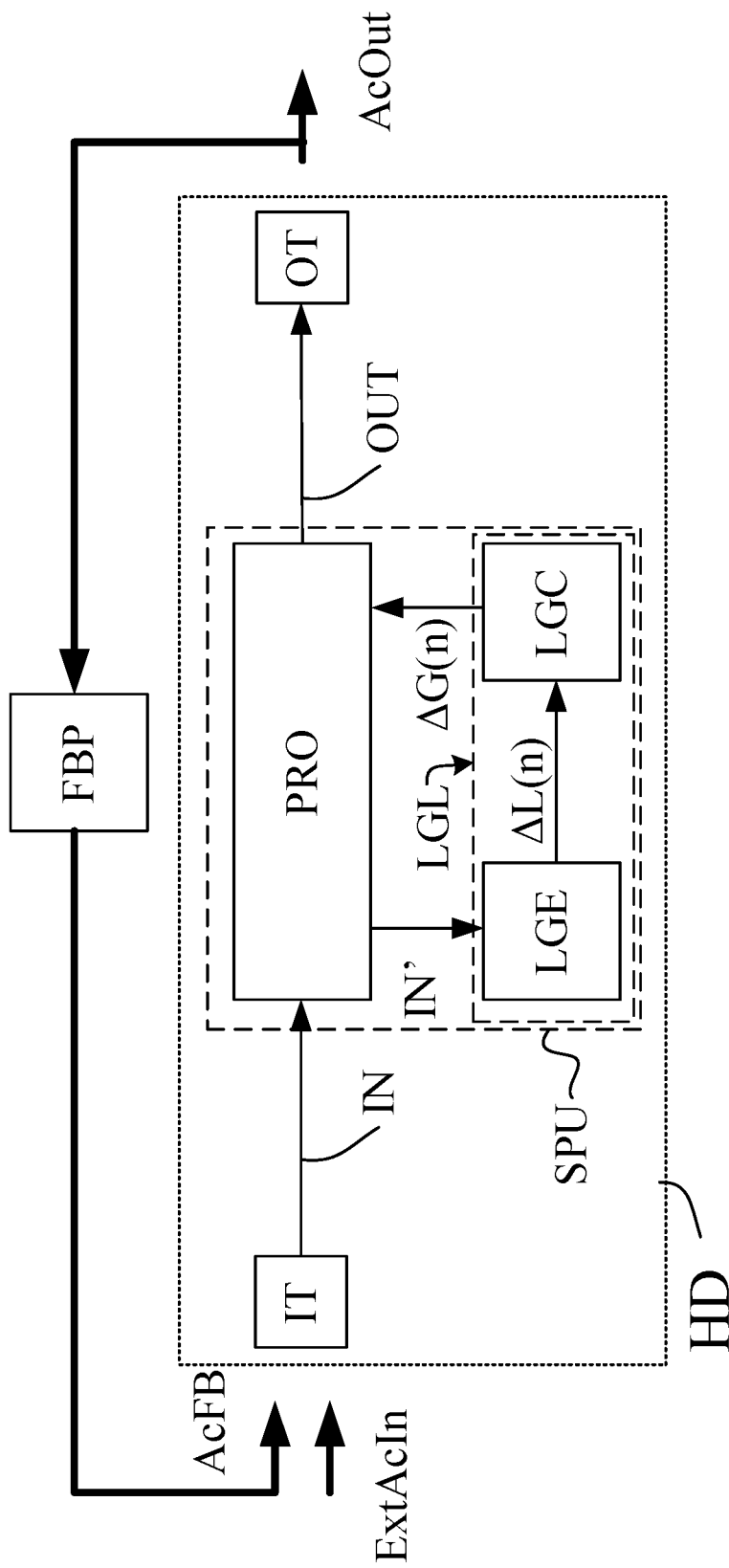
FIG. 1A illustrates a hearing device comprising a loop gain limiter according to a first embodiment of the present disclosure.

FIG. 1A illustrates a hearing device comprising a loop gain limiter (cf. dashed enclosure denoted 'LGL') according to a first embodiment of the present disclosure. The loop gain limiter (LGL) comprises a loop gain estimator (LGE) and a loop gain controller (LGC). The hearing device (HD), e.g. a hearing aid, may e.g. be configured to be worn by a user at or in an ear or to be partially implanted in the head of the user. The hearing device comprises a forward path comprising an input transducer (IT) for providing an electric input signal (IN) representing sound in the environment of the hearing device (ExtAcIn). The forward path further comprises a signal processor (SPU) for processing the electric input signal (IN), or a signal based thereon (e.g. a processed version thereof) and providing a processed signal (OUT). The signal processor (SPU) comprises a compressor for determining a frequency and level dependent desired compressor gain $G_P$ to compensate for a hearing impairment of the user (taking into account possible gain (amplification or attenuation) provided by the input and output transducers). The signal processor is configured to provide a resulting compressor gain $G'_P$. The resulting compressor gain $G'_P$ may be larger than or equal to, or smaller than the desired compressor gain $G_P$. The forward path further comprises an output transducer (OT) for providing output stimuli (AcOut) perceivable as sound for the user based on said processed signal (OUT). A fraction of the acoustic output (AcOut) from the output transducer (OT) may leak to, and be picked up by, the input transducer (IT) (cf. feedback signal (AcFB) in FIG. 1), be amplified by the forward path, output via the output transducer (OT), etc., and under specific conditions (including that loop gain is larger than 1) result in the build-up of oscillations (which may lead to feedback howl). If the input transducer (IT) provides an input gain $G_I$, and the output transducer provides an output gain, $G_O$, a total desired forward path gain G can be defined as $G_I + G_P + G_O$ (in a logarithmic representation; or $G_I \cdot G_P \cdot G_O$ in a linear representation).

The hearing device (HD), here the loop gain limiter (LGL), further comprises a loop gain estimator (LGE) for estimating a current loop gain $\Delta L(n)$, wherein the loop gain estimate is calculated as the current level of a signal of the forward path at time index n minus the level of the same signal one feedback loop earlier. The feedback loop is represented by the electric forward path of the hearing device from the input transducer (IT) to the output transducer (OT) and an acoustic feedback path from the output transducer (OT) to the input transducer (IT).

The feedback path exhibits a feedback gain H. Hence, an unmodified loop gain, LG, would be determined as a sum of the desired forward path gain G and the feedback gain H (in a logarithmic representation), cf. e.g. FIG. 2.

The loop gain may be determined for any signal of the forward path (e.g. the electric input signal (IN), the processed output signal (OUT), or any signal tapped therebetween (IN')).

The hearing device (HD), here the loop gain limiter (LGL), further comprises a loop gain controller (LGC) for dynamically controlling (e.g. reducing) the resulting forward path gain $G'_{FP}$ in dependence of the estimate of the current loop gain $\Delta L(n)$. The loop gain controller provides a control signal ($\Delta G(n)$) to the signal processor (SPU) for modifying the gain of the signal processor from the desired processor gain $G_P$ to the resulting processor gain $G'_P$ to thereby provide a resulting loop gain LG' for the hearing device. The loop gain controller (LGC) may be configured to decrease said resulting forward path gain G' in case the estimate of the current loop gain $\Delta L(n)$ is larger than or equal to a maximum loop gain value LGmax. (e.g. set as a predefined criterion for the hearing aid in question, e.g. defined by a given hearing aid style (open or closed fitting)). Thereby the resulting loop gain LG' is reduced compared to the original loop gain LG (without the loop gain limiter).

Figure 1B:
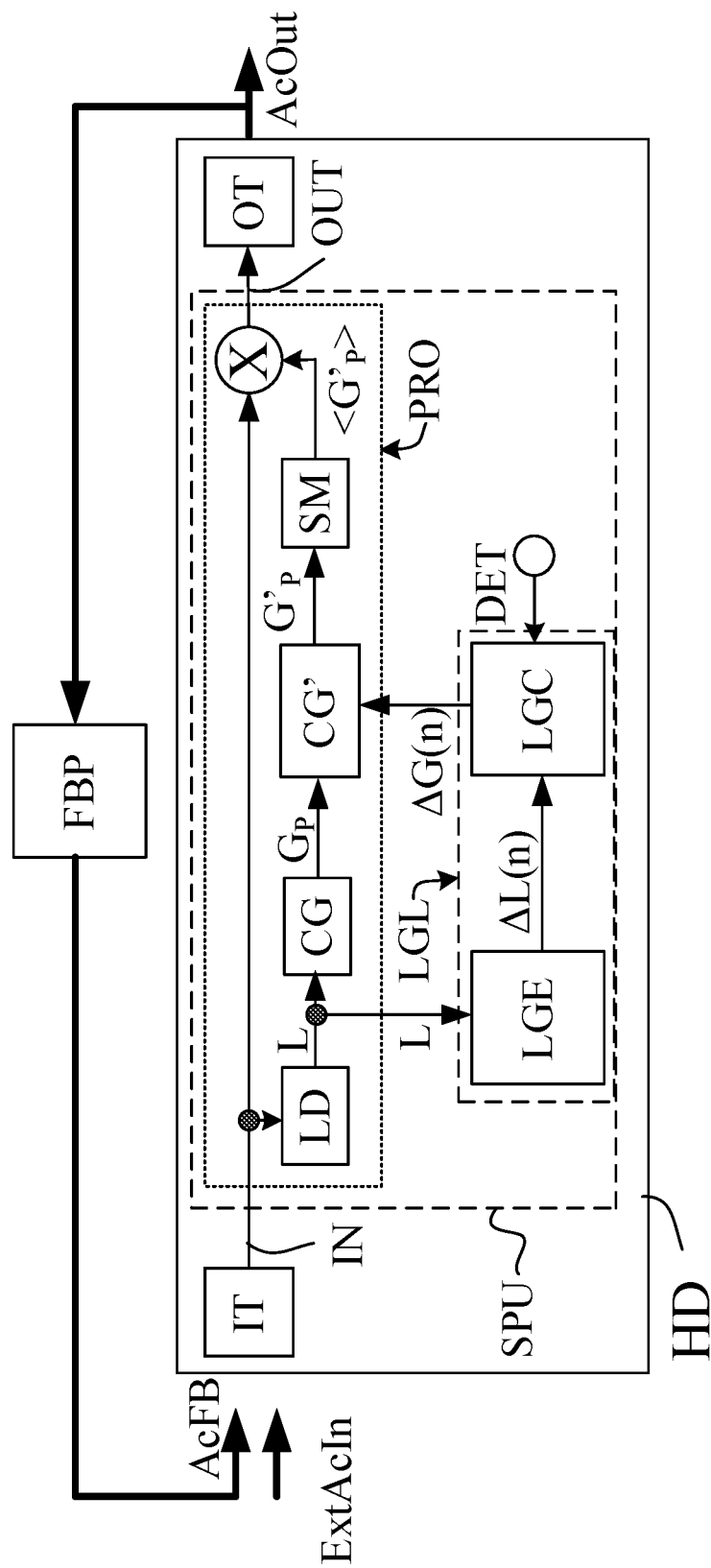
FIG. 1B shows a hearing device comprising a loop gain limiter according to a second embodiment of the present disclosure.

FIG. 1B shows a hearing device comprising a loop gain limiter (LGL) according to a second embodiment of the present disclosure. The embodiment of FIG. 1B is similar to the embodiment pf FIG. 1A, but an embodiment of the signal processor SPU (enclosed in dashed rectangular outline in FIG. 1B) is described in further detail in the following. The electric input signal IN from the input transducer (IT), e.g. a microphone, is fed to the signal processor (SPU), which provides a processed signal OUT which is fed to an output transducer (OT), e.g. a loudspeaker. The signal processor (SPU) of FIG. 1B comprises a level detector (LD) for estimating a level L of the current electric input signal IN (or a signal derived therefrom, e.g. a feedback corrected input signal). The signal processor (SPU) further comprises a compressor (CG) for determining a desired processor gain $G_P$ from the estimated level L of the electric input signal IN (or a signal derived therefrom). The loop gain estimator (LGE) is configured to estimating a current loop gain $\Delta L(n)$ based on the level estimates $L(n)$ and $L(n-1)$ of the level detector (LD) wherein the loop gain $\Delta L(n)$ is determined by a change in level L of a signal of the forward path (here the electric input signal IN) from one loop delay D earlier (n−1) to the current time n, where n is a time index.

Figure 2:
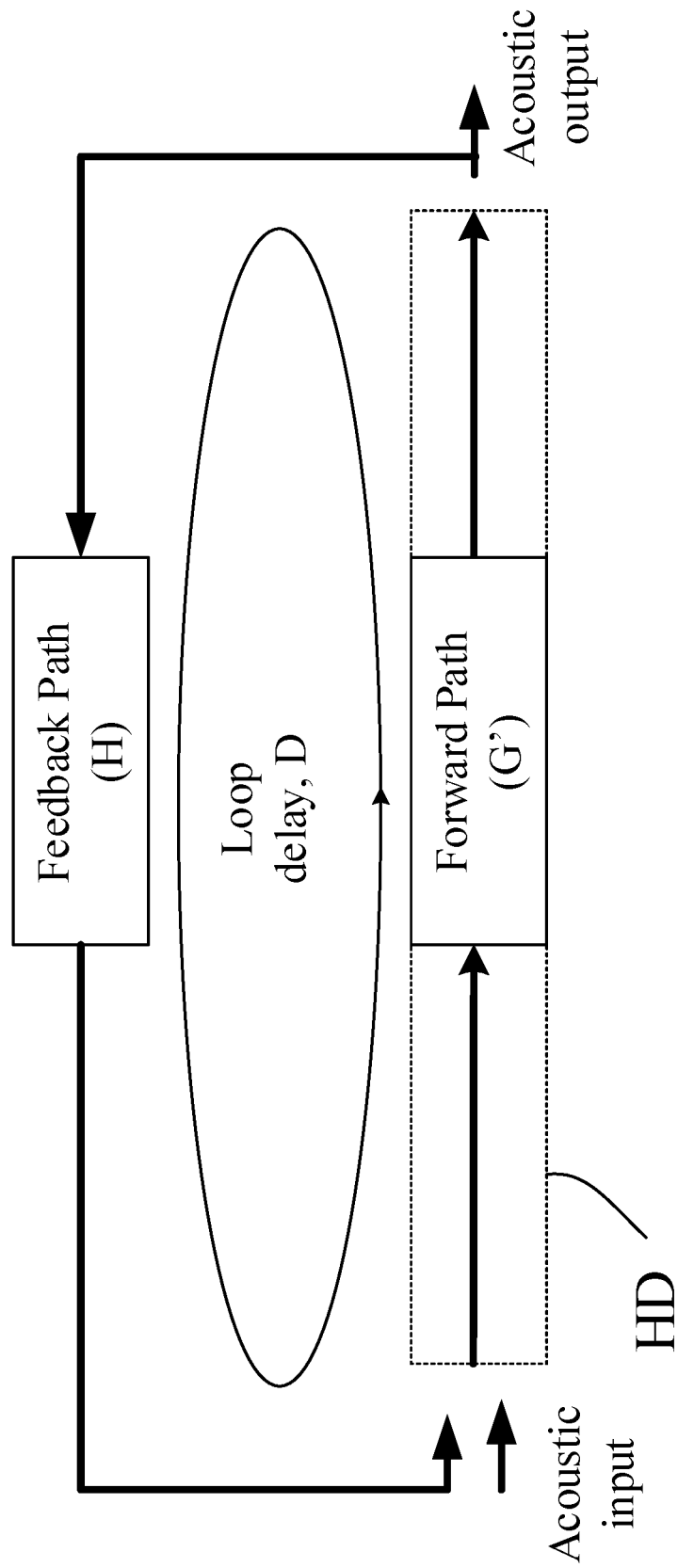
FIG. 2 shows the feedback loop of a hearing device comprising an electric forward path from input to output transducer, and an acoustic (and/or mechanical) feedback loop from output to input transducer.

The feedback loop delay D (or loop delay) is in the present context taken to mean the time required for a signal to travel through the loop consisting of the (electric) Forward Path of the hearing device and the (acoustic) Feedback Path from output transducer to input transducer of the haring device (as illustrated in FIG. 2). The loop delay is taken to include the processing delay d of the (electric) forward path of the hearing device from input to output and the delay d' of the acoustic feedback path from the transducer to the input of the hearing device, in other words, loop delay D=d+d'. At least an estimate of the feedback loop delay is assumed to be known, e.g. measured or estimated in advance of the use of the hearing device, and e.g. stored in a memory or otherwise built into the system. In an embodiment, the hearing device is configured to measure or estimate the loop delay during use (e.g. automatically, e.g. during power-on, or initiated by a user via a user interface). In an embodiment, the hearing device is configured to provide one value of loop magnitude (and possibly loop phase) for each time index m, or for each time period corresponding to a current feedback loop delay (D), i.e. at times m'=p·D, where p=0, 1, 2, . . . , Other periodic or non-periodic schemes or algorithms may be used for providing the values of loop gain.

The hearing device (HD), here the loop gain limiter (LGL), further comprises a loop gain controller (LGC) for dynamically controlling (e.g. reducing) the resulting forward path gain G' in dependence of the estimate of the current loop gain $\Delta L(n)$. In the embodiment of FIG. 1B, the loop gain controller (LGC) further receives one or more inputs from one or more detectors, e.g. an SNR estimator, a correlation detector, a feedback detector, a transient detector, etc. The aim of the detector input(s) (DET) is to make the gain control more robust (to avoid unnecessary gain changes). A resulting (processor) gain $G'_P$ is provided by the gain modification unit (CG') based on a desired (processor) gain $G_P$ (according to a hearing impairment of the user) and on the loop gain control signal ($\Delta G(n)$). The resulting (processor) gain $G'_P$ may be smaller than the desired gain $G_P$, if the estimated current loop gain $\Delta L(n)$ is larger than a desired maximum threshold value (LGmax), or equal to the desired gain $G_P$, if the estimated current loop gain $\Delta L(n)$ is smaller than or equal to the desired maximum threshold value (LGmax). An algorithm for determining a resulting gain G' in dependence of the current loop gain $\Delta L(n)$ is described below (cf. e.g. eq. (1)). The hearing device (HD) further comprises a smoothing unit (SM) for smoothing the resulting gain $G'_P$ over time, and providing a smoothed resulting gain $<G'_P>$. An algorithm for providing such smoothing is described below. The forward path of the hearing device (HD) further comprises a combination unit ('X') for applying the resulting (e.g. $G'_P$ or the corresponding smoothed processor gain $<G'_P>$, respectively) to the electric input signal (IN), thereby providing the processed output signal (OUT), which is fed to the output transducer (OT) for presentation to the user.

Figure 1C:
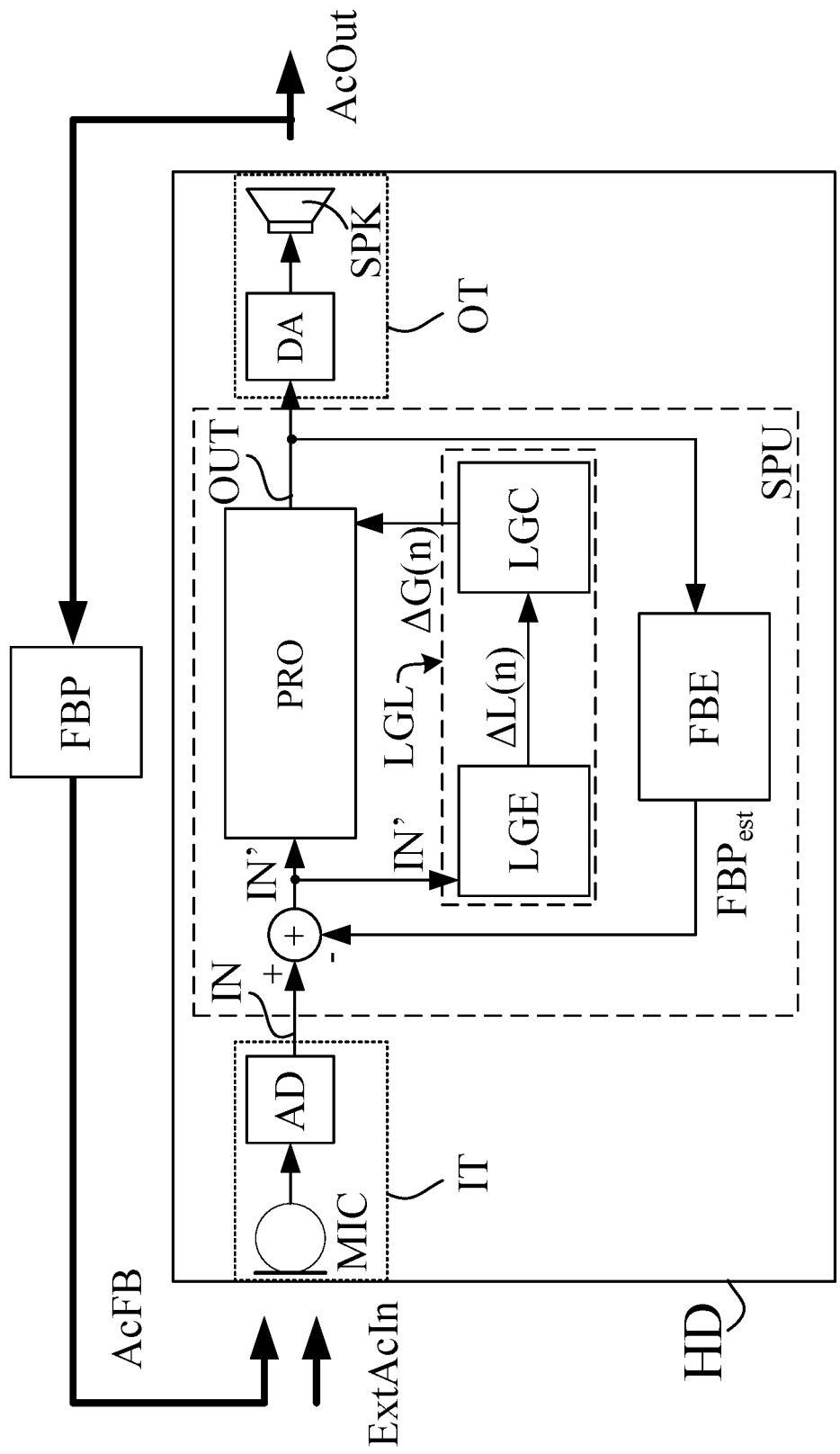
FIG. 1C shows a hearing device comprising a loop gain limiter according to a third embodiment of the present disclosure.

FIG. 1C shows a hearing device comprising a loop gain limiter (LGL) according to a third embodiment of the present disclosure. The embodiment of FIG. 1C is similar to the embodiment of FIG. 1A, but embodiments of the input (IT) and output (OT) transducers (enclosed in dashed rectangular outline in FIG. 1C) are described in further detail in the following. The embodiment of FIG. 1C further comprises a feedback control system comprising a feedback estimation unit (FBE) and a combination unit ('+'). The input transducer (IT) comprises a microphone (MIC) for picking up a sound (ExtAcIn (and AcFB)) from the environment and providing an analogue electric input signal, and an analogue to digital converter (AD) for converting the analogue electric input signal to a (digital) electric input signal (IN), which is fed to the processor (SPU), in particular to the combination unit ('+'), here a subtraction unit of the feedback control system. The output transducer (OT) comprises a digital to analogue converter (DA) for converting a signal (OUT) from the processor (SPU) (here from the signal processor (PRO)) to an analogue signal, which is fed to loudspeaker (SPK) for conversion to an acoustic signal (AcOut). The feedback estimation unit (FBE) of the feedback control system of the embodiment of a hearing device (HD) of FIG. 1C is configured to estimate feedback path (FBP) from the output transducer (OT) to the input transducer (IT) and to provide a signal $FBP_{est}$ representative of such estimate. The feedback path estimate is subtracted from the (digitized) input signal (IN) in subtraction unit ('+') to thereby provide a feedback corrected input signal IN'. The feedback corrected input signal IN' is fed to the signal processor (PRO) and to the loop gain estimator (LGE) as discussed in connection with FIGS. 1A and 1B. The feedback corrected input signal IN' may further be feed to the feedback estimation unit (FBE), e.g. in case the feedback estimate $FBP_{est}$ is provided by an adaptive filter. In such case, the feedback corrected input signal IN' is fed to an adaptive algorithm for determining updated filter coefficients of a variable filter, the adaptive algorithm and the variable filter together constituting the adaptive filter. In the embodiment of FIG. 1C, the loop gain estimator (LGE) thus works on a feedback corrected input signal (which may still contain uncompensated feedback components).

The embodiments of a hearing device (HD) shown in FIG. 1A-1C may comprise one or more filter banks allowing that some or all signal processing of the forward path may be conducted in the frequency domain. Alternatively, some or all signal processing of the forward path may be conducted in the time domain.

FIG. 2 shows the feedback loop of a hearing device comprising an electric forward path from input to output transducer, and an acoustic (and/or mechanical) feedback loop from output to input transducer.

Knowledge (e.g. an estimate or a measurement) of the length of one loop delay is assumed to be available.

The loop delay D is defined as the time required for a signal travelling (once) through the acoustic loop, as illustrated in FIG. 2. The acoustic loop consists of the forward path (of the hearing device), and the (acoustic) feedback path. The loop delay D is taken to include the processing delay d of the (electric) forward path (Forward Path) of the hearing device from input transducer to output transducer and the delay d' of the acoustic feedback path (Feedback Path) from the output transducer to the input transducer of the hearing device, LoopDelay D=d+d'.

Typically, the acoustic part d' of the loop delay is much less than the electric (processing) part d of the loop delay, d'<<d (in particular when the forward path comprises processing of signals in frequency sub-bands). The loop delay D may be approximated by the processing delay d of the forward path of the hearing device (D≈d). The electric (processing) part d of the loop delay may e.g. be in the range between 2 ms and 10 ms, e.g. in the range between 5 ms and 8 ms, e.g. around 7 ms. The loop delay may be relatively constant over time (and e.g. determined in advance of operation of the hearing device) or be different at different points in time, e.g. depending on the currently applied algorithms in the signal processing unit (e.g. dynamically determined (estimated) during use). The hearing device (HD) may e.g. comprise a memory unit wherein typical loop delays in different modes of operation of the hearing device are stored. In an embodiment, the hearing device is configured to measure a loop delay comprising a sum of a delay d of the forward path and a delay d' of the feedback path. A predefined (or otherwise determined) test-signal may e.g. be inserted in the forward path, and its round trip travel time measured (or estimated), e.g. by identification of the test signal when it arrives in the forward path after a single propagation (or a known number of propagations) of the loop. The test signal may be configured to included significant content at frequencies where feedback is likely to occur (e.g. in a range between 1 and 4 kHz).

Loop Gain Estimation

The first part of the concept according to the present disclosure comprises an estimation of the actual loop gain $\Delta L$ (in dB) for each feedback loop (one feedback loop⇒the signal travels once around the acoustic loop including forward path (of the hearing aid) and acoustic feedback path, cf. FIG. 2). The gain contribution of the feedback path is unknown, but the effect of the total loop gain can be observed during a feedback build-up. When the instrument becomes unstable, i.e. feedback is building up, the signal level increases after each loop by a level amount that corresponds to the loop gain. Hence, by assuming that feedback is currently building up and by assuming a certain loop delay D, we can estimate the loop gain based on the signal level difference from one loop to the next. This can be done by determining $$\Delta L(n) = L(n) - L(n - n_D),$$

where $L(n)$ is the electric input (e.g. microphone) signal level (in dB) at the time index n, and $L(n-n_D)$ is the signal level of the same signal one feedback loop early (in other words one loop delay D earlier, where $n_D$ is defined by the loop delay D). The level may be sampled by a frequency of $1/D$ or any other sampling frequency $f_s$, preferably configured to provide that the loop delay D can be represented by a number p of sampling time units $1/f_s$, e.g. $D = p/f_s$ (or $n_D = p$), where p is an integer. The loop gain may alternatively be determined based on a smoothed or filtered version of the input signal level L.

The main feature of the proposed loop gain estimator is its speed. As it may be based only on level information from the forward path and the assumption about the current loop delay. The loop delay may be predefined or estimated during wearing time. By explicitly excluding more advanced information from e.g. a correlation detector, the resulting loop gain estimate may be of worse quality, but it can be calculated within the shortest possible time. In fact, in the situation of a sudden strong feedback build-up, the proposed estimator is able to provide a loop gain estimate within the time corresponding to 1 feedback loop.

The underlying loop gain LG is given by $$LG = G + H,$$

where G is the desired forward path gain, whereas H is the feedback path gain in a logarithmic representation, where levels are given relative to a common reference level. $LG = G \cdot H$ in a linear representation. Typically $0 < H < 1$ (attenuation) in a linear representation, i.e. corresponding to $H < 0$ in a logarithmic representation.

The Basic Loop Gain Limiting Processing

The value of this loop gain estimate $\Delta L$ (in dB) is then used to control the applied forward path gain G' (in dB) for the feedback loop as $$G'(n) = G(n) - \max\left(\frac{\Delta L(n) - LG\max}{a}, 0\right) \quad (1)$$

Where G'(n) is the resulting gain and G(n) is the desired compressor gain at time instance n. The parameter a is used to control the degree of loop gain limitation, the default value is a=1. The larger the value of a, the less loop gain limitation is provided. Equation (1) is an exempla of an expression for the resulting gain at a present time n which depends on the loop gain estimate $\Delta L(n)$ at time n. Other expressions may be envisioned, e.g. a dependence not only on $\Delta L(n)$ but also on $\Delta L(n-1)$, $\Delta L(n-2)$, $\Delta L(n-3)$, . . . ).

Equation (1) implies that if the loop gain per feedback loop, $\Delta L$, is below or equal to the maximum allowed loop gain value LGmax, G'=G, i.e., no forward gain reduction for reducing loop gain.

On the other hand, if the loop gain estimate $\Delta L$ is bigger than the maximum allowed loop gain value LGmax, a reduction is applied to the desired forward gain G to form the applied forward path gain G'. For example, if $\Delta L = 20$ dB, and LGmax=6 dB, we obtain G'=G−14 dB (for a=1), i.e., a reduction of 14 dB.

This limitation of G to G' implies that the actual loop gain $\Delta L$ in the next feedback loop will be exactly equal to the maximum allowed loop gain value, i.e., $\Delta L = L G \max = 6$ dB, hereby in the second loop, we allow G'=G, i.e., without any reduction.

Figure 3:
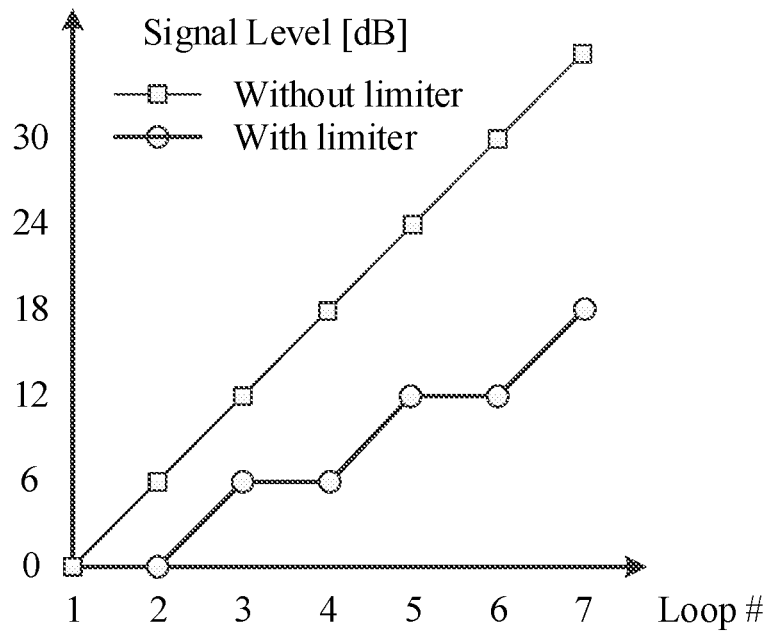
FIG. 3 shows a schematic example of the signal level limitation for a signal with dynamic level over time.

If the underlying loop gain LG remains the same, i.e., both the G and H remain constant, and the parameter a=1, the gain pattern for G' will be, G'=G−max($\Delta L(n)$−LGmax,0), G, G'=G−max($\Delta L(n)$−LGmax,0), G, . . . as illustrated in FIG. 3.

FIG. 3 shows a schematic example of the signal level limitation for a signal with dynamic level over time. FIG. 3 shows the signal level L after each loop (x-axis is number of loops (Loop #), y-axis is signal level L in [dB] (Signal Level [dB]). LG=6 dB, LGmax=0 dB, and the limitation parameter a=1. The straight line indicated by square open symbols □ represents development of signal levels without a gain limiter. The step step-like graph indicated by open circular symbols ○ represents development of signal levels provided by an embodiment of a gain limiter according to the present disclosure.

Furthermore, the limited loop gain provides a steady-state average signal level increase $\Delta L_{avg}$ which can be computed as $$\Delta L_{avg} = \frac{a}{a+1} \cdot LG + \frac{1}{a+1} \cdot LG\max$$

Which is derived for LG≥LGmax in the following:

$$L(n+1) = L(n) + \left(LG - \frac{\Delta L(n) - LG\max}{a}\right)$$

-continued $$L(n+1) - L(n) = LG - \frac{\Delta L(n) - LG\max}{a}$$

$$\Delta L(n+1) = LG - \frac{\Delta L(n) - LG\max}{a}$$

Now considering n→∞ (steady-state), $$\Delta L_{avg} = LG - \frac{\Delta L_{avg} - LG\max}{a}$$

$$\Delta L_{avg} + \frac{\Delta L_{avg}}{a} = LG + \frac{LG\max}{a}$$

$$\Delta L_{avg} = \frac{a}{a+1} \cdot LG + \frac{1}{a+1} \cdot LG\max$$

Figure 4A:
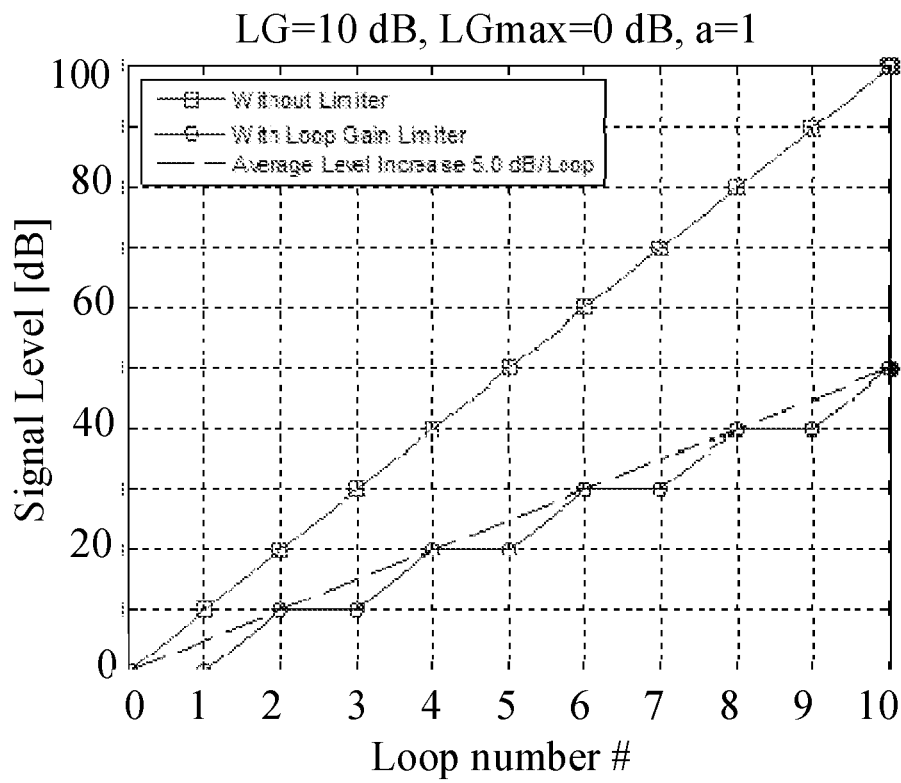
FIG. 4A illustrates average signal level increase [dB] with loop gain limitation, where loop gain LG=10 dB, maximum loop gain LGmax=0 dB, and the limitation parameter a=1.
Figure 4B:
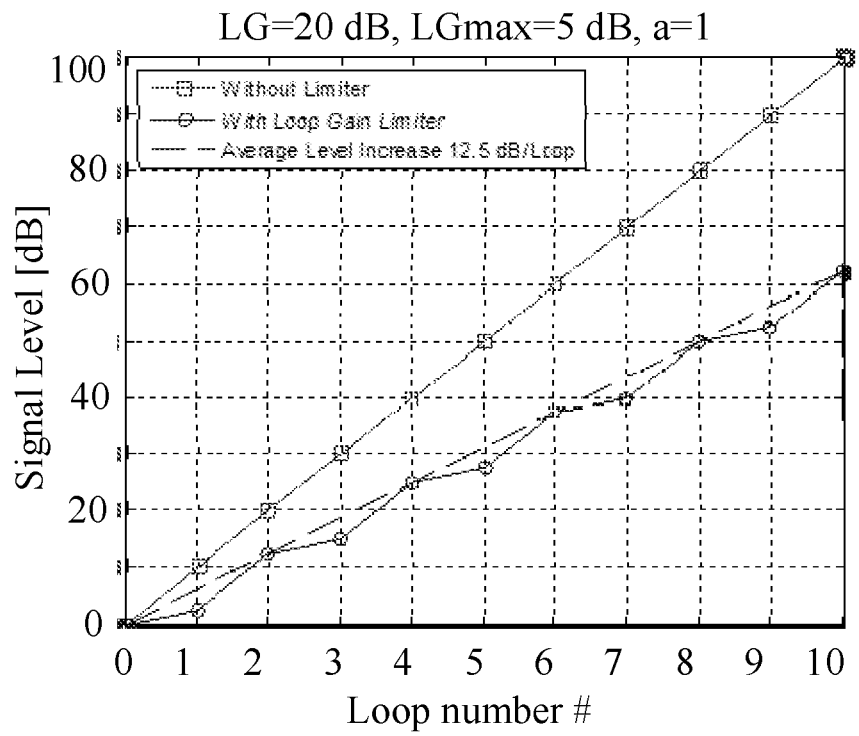
FIG. 4B illustrates average signal level increase [dB] with loop gain limitation, where LG=20 dB, LGmax=5 dB, and the limitation parameter a=1.
Figure 4C:
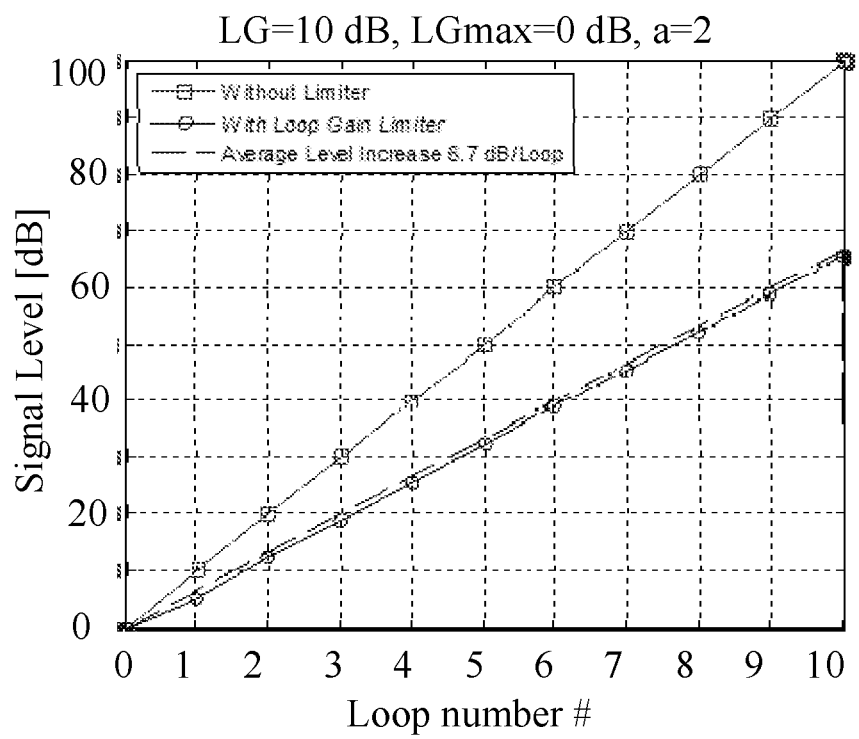
FIG. 4C illustrates average signal level increase [dB] with loop gain limitation, where LG=10 dB, LGmax=0 dB, and the limitation parameter a=2, FIG. 5 schematically illustrates an activation range for the gain limitation, wherein a rising signal level can be limited, whereas a falling signal level remains unaffected.

A few examples of the average signal level increase $\Delta L_{avg}$ are illustrated in FIG. 4A, 4B, 4C.

FIG. 4A shows average signal level increase [dB] with loop gain limitation, where loop gain LG=10 dB, maximum loop gain LGmax=0 dB, and the limitation parameter a=1. FIG. 4B illustrates average signal level increase [dB] with loop gain limitation, where LG=20 dB, LGmax=5 dB, and the limitation parameter a=1. FIG. 4C illustrates average signal level increase [dB] with loop gain limitation, where LG=10 dB, LGmax=0 dB, and the limitation parameter a=2. The legend used in FIG. 4A-4C is the same used in FIG. 3: The straight line indicated by square open symbols □ represents development of signal levels without a gain limiter. The step-like graph indicated by open circular symbols ○ represents development of signal levels provided by an embodiment of a gain limiter according to the present disclosure. Further, the straight dashed line indicates an average level increase (in dB) per loop. The (unmodified) signal levels vary between 0 dB and 100 dB over 10 loops (reflecting that howl can build up very fast, here over 50-100 ms).

From FIG. 4A, 4B, 4C we observe that with a loop gain limiter according to the present disclosure, a smaller (average) increase is allowed for each feedback loop. Hence, it will limit the severity of feedback build-up. By varying parameters LGmax and a, the deviation from linearity of the resulting gain G' (and thus a potential need for smoothing thereof, cf. FIG. 1C) can be influenced.

Signal Level Limiting Effect

Figure 5:
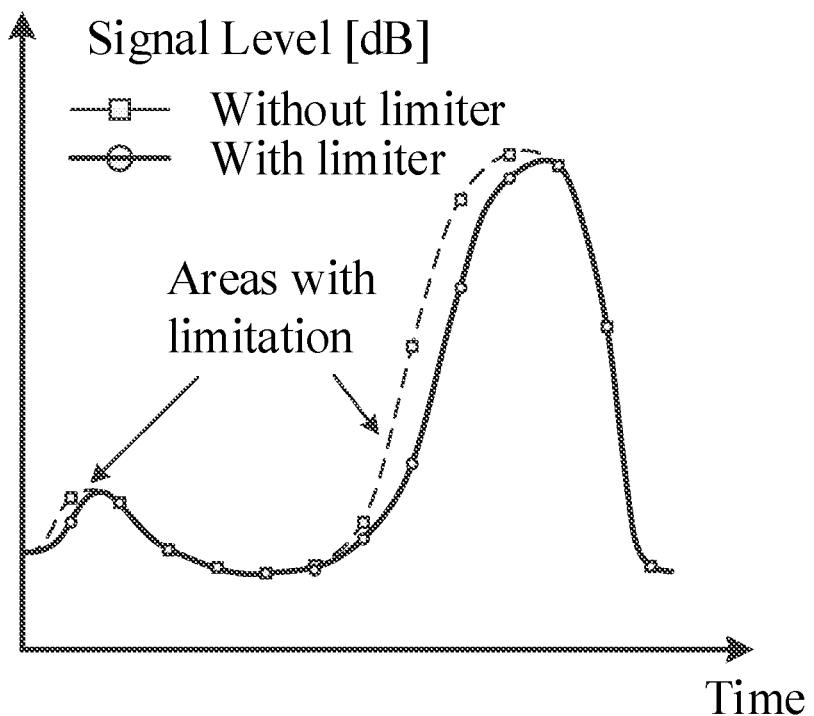

FIG. 5 schematically illustrates an activation range for the gain limitation, wherein a rising signal level can be limited, whereas a falling signal level remains unaffected. The raising signal level can be limited (cf. indication 'Areas with limitation'), whereas the falling signal level is unaffected. The same notation as used in FIG. 3 is applied for the respective graphs regarding the symbols indicating calculation points for the respective graphs.

Gain Smoothing

The applied gain G' (n) determined based on (1) can jump in its value. In the example shown in FIG. 4A, the applied gain for each feedback loop is illustrated in FIG. 6.

Figure 6:
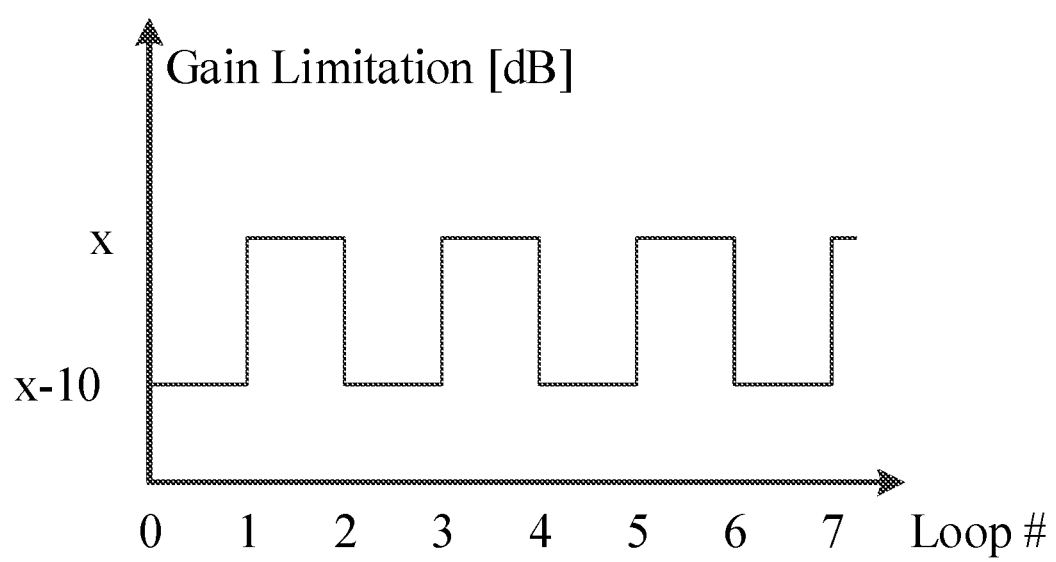
FIG. 6 shows the applied gain limitation in the example shown in FIG. 4A.

FIG. 6 shows the applied gain limitation in the example shown in FIG. 4A as a function of loop number (Loop #). The parameter x may represent a desired processor gain $G_P$ (or total desired compressor gain G). The gain reduction ΔG per loop is in the example of FIG. 6 set to 10 dB (e.g. represented by the second term of Eq. (1) above:

$$\Delta G = \max\left(\frac{\Delta L(n) - LG\max}{a}, 0\right)$$

This may be provided in case ΔL(n)=10 dB, LGmax=0 dB and a=1.

In this case, the applied gain is a square function, other shapes of the applied gain can also occur, and they can have big jumps in its value. This jumping gain value is typically not good for sound quality, and we would like to avoid that. This can be done using a smoothing filter, e.g. a first order IIR filter, so that the smoothed gain G*(n) is computed as $$G^*(n) = \beta \cdot G'(n) + (1-\beta) \cdot G^*(n-1)$$

where β is the filter coefficient, and β is positive and close to 0, e.g. <0.2.

Activation Range (Vs. Transient Noise Reduction)

Figure 7:
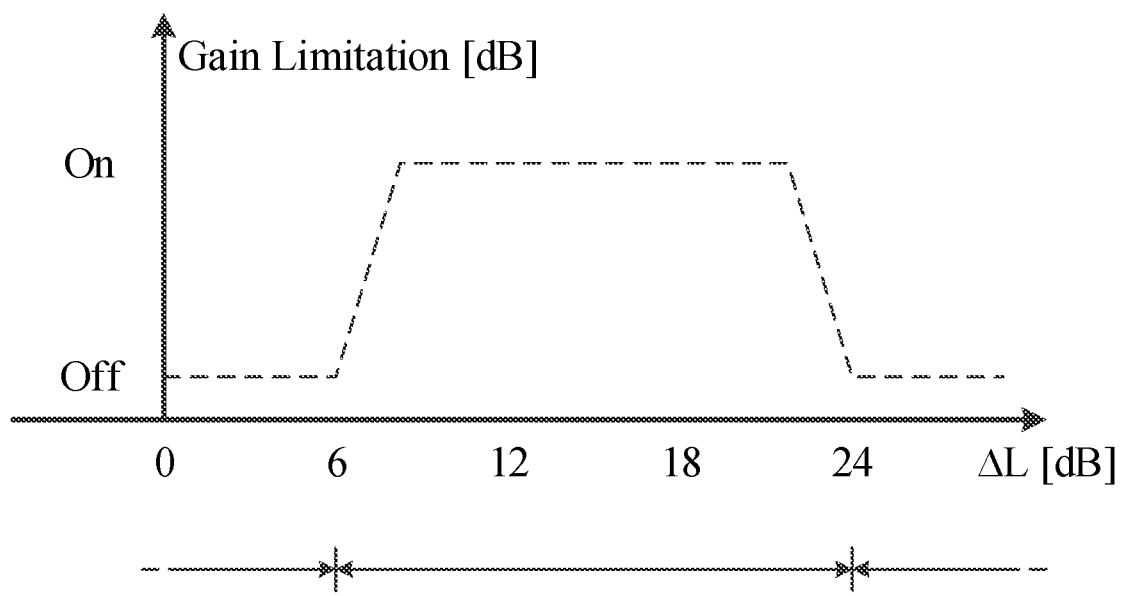
FIG. 7 shows a strategy for applying the gain limitation only within a certain range.

FIG. 7 illustrates a strategy for applying the gain limitation only within a certain range. Preferably, the gain limitation should only be activated within a certain range. For very low loop gain (here exemplified as <+6 dB), there is no need for reducing forward gain, because a feedback control system can handle the feedback situation. For very high loop gains (expected to be due to transient input signals) no gain reduction is needed for reducing feedback. For very high loop gains (ΔL, here ≥+24 dB), e.g., when it is beyond what is physical possible for a given system setup, the estimated loop gain does not represent the feedback situation, but it could be caused by the transient/onsets of the input signal. In this case, no gain limitation should be applied unless a transient protection is desired. Loop gains beyond what is physically possible, can e.g. be beyond +20 dB, when the hearing aid gain is fitted so that the loop gain is 0 dB with no obstacles close to hearing aid, and we know that variations in feedback path, e.g., when a phone is placed close to the hearing aid, can increase the loop gain to maximum +20 dB.

In a related field of transient noise reduction, the signal level difference is also computed, and based on that a gain limitation is applied to suppress transients. However, the main differences to this loop gain limiter concept are two-fold.

First, the level difference estimate in the loop gain limiter concept has to be the loop gain estimation, and it is not the case for the transient noise reduction. In other words, the time frame for computing the level difference can be chosen more freely for transient noise reduction, whereas for the loop gain limiter the time frame has to be chosen according to loop delay (equal to the sum of an acoustic feedback delay from the output transducer to the input transducer and an electric forward (processing) path delay of the hearing device from the input transducer to the output transducer).

Second, FIG. 7 can be used for the loop gain limitation concept, whereas it does not apply for the transient noise reduction. The level difference can be as large as 50-80 dB for the transient noise reduction, whereas it would very likely to be a false detection for loop gain limiter.

The applied gain G' determined by equation (1) does only take into account of the current loop gain estimate ΔL(n) and the loop gain threshold LGmax. The concept of loop gain limiter can be improved by also taking account the gain reduction already applied.

More specifically, if the estimate ΔL(n) is equal to the LGmax, according to equation (1), G'=G, i.e., no gain reduction should be applied. However, if ΔL(n)=LGmax because G' was already reduced from G, allowing G'=G would lead to $\Delta L(n) > LG_{max}$ in the next loop, as described earlier. The applied gain G' and loop gain $\Delta L(n)$ will jump forth and back as a consequence. By taking into account the latest gain reduction $\Delta G(n-1) = G - G'(n-1)$, one can improve the gain reduction G' to avoid gain (and loop gain) jumps. The latest gain reduction loop gain estimate $\Delta G(n-1)$ can be added to loop gain estimate $\Delta L(n)$ to obtain a corrected loop gain estimate, and we then compute the gain reduction G' based on that. In the previous example, the second loop estimation would actually show that the corrected loop gain is still critical, and again the applied gain G' should be reduced. This can avoid the gain and loop gain jumps.

However, when using $\Delta G(n-1)$ to improve $G'(n)$, we should consider to use a leaking factor on $\Delta G(n-1)$ to avoid a constant gain reduction or even oscillations. A step input signal can e.g. cause a constant attenuation if we compensate $\Delta L(n)$ with $\Delta G(n-1)$, and this can be avoided by using a leak factor on $\Delta G(n-1)$.

Figure 8:
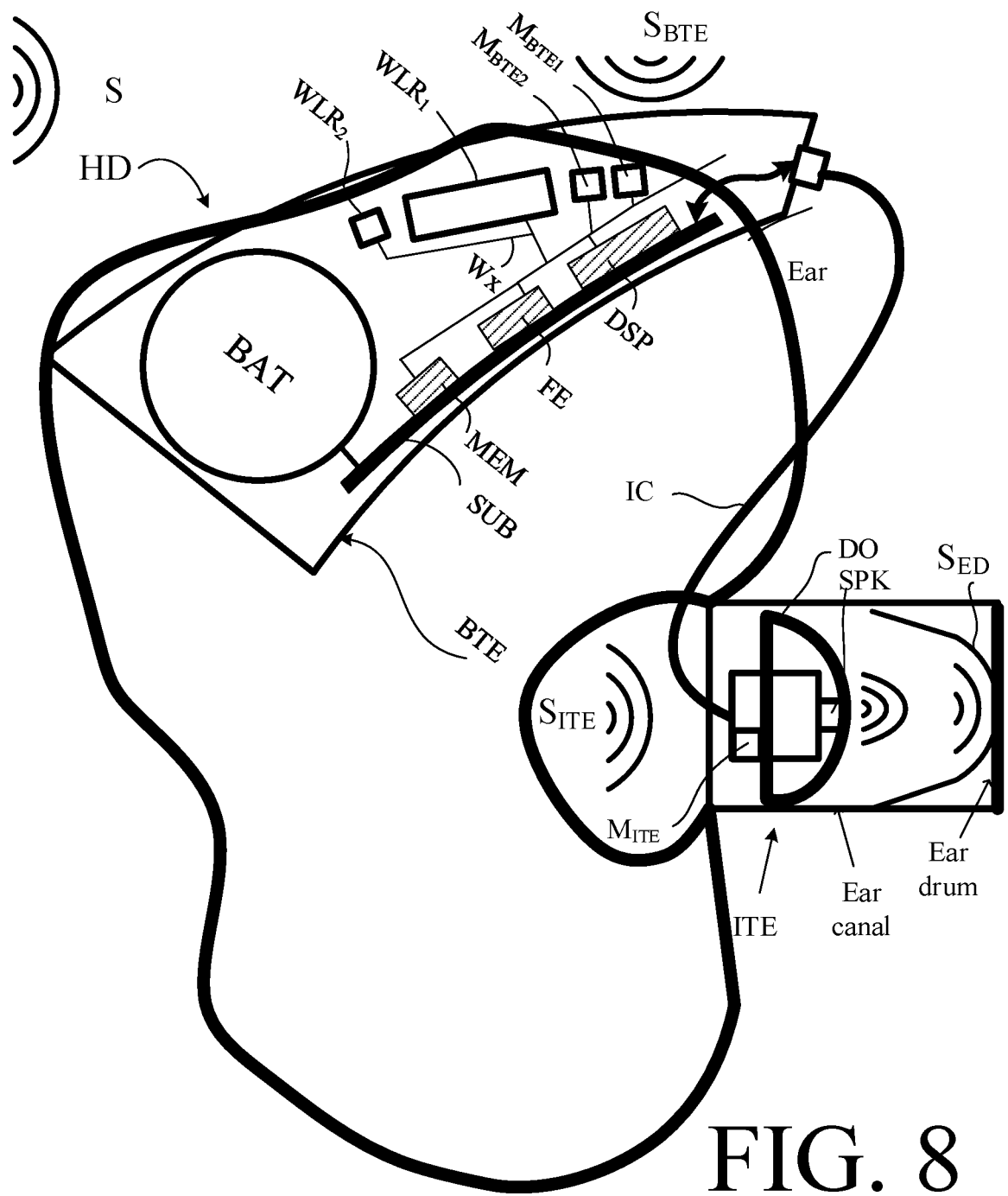
FIG. 8 shows an embodiment of a hearing device (HD) according to the present disclosure.

FIG. 8 shows an embodiment of a hearing device (HD) according to the present disclosure. The hearing device (HD), e.g. a hearing aid, is of a particular style (sometimes termed receiver-in-the ear, or RITE, style) comprising a BTE-part (BTE) adapted for being located at or behind an ear of a user, and an ITE-part (ITE) adapted for being located in or at an ear canal of the user's ear and comprising a receiver (loudspeaker). The BTE-part and the ITE-part are connected (e.g. electrically connected) by a connecting element (IC) and internal wiring in the ITE- and BTE-parts (cf. e.g. wiring Wx in the BTE-part). The connecting element may alternatively be fully or partially constituted by a wireless link between the BTE- and ITE-parts.

In the embodiment of a hearing device in FIG. 8, the BTE part comprises two input units comprising respective input transducers (e.g. microphones) ($M_{BTE1}$, $M_{BTE2}$), each for providing an electric input audio signal representative of an input sound signal ($S_{BTE}$) (originating from a sound field S around the hearing device). The input unit further comprises two wireless receivers ($WLR_1$, $WLR_2$) (or transceivers) for providing respective directly received auxiliary audio and/or control input signals (and/or allowing transmission of audio and/or control signals to other devices, e.g. a remote control or processing device or a telephone). The hearing device (HD) comprises a substrate (SUB) whereon a number of electronic components are mounted, including a memory (MEM) e.g. storing different hearing aid programs (e.g. parameter settings defining such programs, or parameters of algorithms, e.g. optimized parameters of a neural network) and/or hearing aid configurations, e.g. input source combinations ($M_{BTE1}$, $M_{BTE2}$, $M_{ITE}$, $WLR_1$, $WLR_2$), e.g. optimized for a number of different listening situations. In a specific mode of operation, two or more of the electric input signals (e.g. from the microphones) are combined to provide a beamformed signal provided by applying appropriate complex weights to (at least some of) the respective signals. The memory (MEM) may e.g. comprise different sets of parameters for a loop gain limiter according to the present disclosure.

The substrate (SUB) further comprises a configurable signal processor (DSP, e.g. a digital signal processor), e.g. including a processor for applying a frequency and level dependent gain, e.g. providing beamforming, noise reduction, filter bank functionality, and other digital functionality of a hearing device, e.g. implementing a loop gain estimator and a feedback control unit, according to the present disclosure (as e.g. discussed in connection with FIG. 1A-1C). The configurable signal processor (DSP) is adapted to access the memory (MEM). The configurable signal processor (DSP) is further configured to process one or more of the electric input audio signals and/or one or more of the directly received auxiliary audio input signals, based on a currently selected (activated) hearing aid program/parameter setting (e.g. either automatically selected, e.g. based on one or more sensors, or selected based on inputs from a user interface). The mentioned functional units (as well as other components) may be partitioned in circuits and components according to the application in question (e.g. with a view to size, power consumption, analogue vs. digital processing, acceptable latency, etc.), e.g. integrated in one or more integrated circuits, or as a combination of one or more integrated circuits and one or more separate electronic components (e.g. inductor, capacitor, etc.). The configurable signal processor (DSP) provides a processed audio signal, which is intended to be presented to a user. The substrate further comprises a front-end IC (FE) for interfacing the configurable signal processor (DSP) to the input and output transducers, etc., and typically comprising interfaces between analogue and digital signals (e.g. interfaces to microphones and/or loudspeaker(s)). The input and output transducers may be individual separate components, or integrated (e.g. MEMS-based) with other electronic circuitry.

The hearing device (HD) further comprises an output unit (e.g. an output transducer) providing stimuli perceivable by the user as sound based on a processed audio signal from the processor or a signal derived therefrom. In the embodiment of a hearing device in FIG. 8, the ITE part comprises the output unit in the form of a loudspeaker (also termed a 'receiver') (SPK) for converting an electric signal to an acoustic (air borne) signal, which (when the hearing device is mounted at an ear of the user) is directed towards the ear drum (Ear drum), where sound signal ($S_{ED}$) is provided. The ITE-part further comprises a guiding element, e.g. a dome, (DO) for guiding and positioning the ITE-part in the ear canal (Ear canal) of the user. The ITE-part further comprises a further input transducer, e.g. a microphone ($M_{ITE}$), for providing an electric input audio signal representative of an input sound signal ($S_{ITE}$) at the ear canal. In other embodiments, the output transducer may comprise a vibrator of a bone conduction hearing aid.

The electric input signals (from input transducers $M_{BTE1}$, $M_{BTE2}$, $M_{ITE}$) may be processed in the time domain or in the (time-) frequency domain (or partly in the time domain and partly in the frequency domain as considered advantageous for the application in question).

The embodiments of a hearing device (HD) exemplified in FIGS. 1A-1C and 8 are portable devices comprising a battery (BAT), e.g. a rechargeable battery, e.g. based on Li-Ion battery technology, e.g. for energizing electronic components of the BTE- and possibly ITE-parts. In an embodiment, the hearing device, e.g. a hearing aid, is adapted to provide a frequency dependent gain and/or a level dependent compression and/or a transposition (with or without frequency compression) of one or more frequency ranges to one or more other frequency ranges, e.g. to compensate for a hearing impairment of a user. The BTE-part may e.g. comprise a connector (e.g. a DAI or USB connector) for connecting a 'shoe' with added functionality (e.g. an FM-shoe or an extra battery, etc.), or a programming device, or a charger, etc., to the hearing device (HD).

It is intended that the structural features of the devices described above, either in the detailed description and/or in the claims, may be combined with steps of the method, when appropriately substituted by a corresponding process.

As used, the singular forms "a," "an," and "the" are intended to include the plural forms as well (i.e. to have the meaning "at least one"), unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will also be understood that when an element is referred to as being "connected" or "coupled" to another element, it can be directly connected or coupled to the other element but an intervening element may also be present, unless expressly stated otherwise. Furthermore, "connected" or "coupled" as used herein may include wirelessly connected or coupled. As used herein, the term "and/or" includes any and all combinations of one or more of the associated listed items. The steps of any disclosed method is not limited to the exact order stated herein, unless expressly stated otherwise.

It should be appreciated that reference throughout this specification to "one embodiment" or "an embodiment" or "an aspect" or features included as "may" means that a particular feature, structure or characteristic described in connection with the embodiment is included in at least one embodiment of the disclosure. Furthermore, the particular features, structures or characteristics may be combined as suitable in one or more embodiments of the disclosure. The previous description is provided to enable any person skilled in the art to practice the various aspects described herein. Various modifications to these aspects will be readily apparent to those skilled in the art, and the generic principles defined herein may be applied to other aspects.

The claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more.

Accordingly, the scope should be judged in terms of the claims that follow.

The invention claimed is:

1. A hearing device configured to be worn by a user at or in an ear, the hearing device comprising
    a forward path comprising
        an input transducer for providing an electric input signal representing sound in the environment of the hearing device, the input transducer providing an input gain $G_I$,
        a signal processor for processing said electric input signal or a signal based thereon and providing a processed signal, the signal processor comprising a compressor for determining a frequency and level dependent desired compressor gain $G_P$ to compensate for a hearing impairment of the user, and to provide a resulting compressor gain $G'_P$,
        an output transducer for providing output stimuli perceivable as sound for the user based on said processed signal, the output transducer providing an output gain, $G_O$, a resulting forward path gain G' being defined in a logarithmic representation as $G_I + G'_P + G_O$,
    a loop gain limiter comprising
        a loop gain estimator for continuously estimating a current loop gain $\Delta L(n)$, configured to provide a loop gain estimate within a predefined number of feedback loop delays after a feedback buildup has started, wherein the loop gain estimate is calculated as the current level of a signal of the forward path at time index n minus the level of the same signal one feedback loop earlier,
        a loop gain controller for dynamically controlling said resulting forward path gain G' in dependence of said estimate of said current loop gain $\Delta L(n)$,
    an acoustic feedback path from the output transducer to the input transducer, the feedback path exhibiting a feedback gain H,
    wherein a resulting loop gain, LG', is determined as a sum of the resulting forward path gain G' and the feedback gain H when given in a logarithmic representation, and
    wherein the loop gain controller is configured to provide that the resulting loop gain is limited to stay below a predefined value.

2. A hearing device according to claim 1 wherein the loop gain controller is configured to decrease said resulting forward path gain G' in case said estimate of said current loop gain $\Delta L(n)$ is larger than or equal to a maximum loop gain value LGmax.

3. A hearing device according to claim 1 configured to estimate the current loop gain $\Delta L(n)$ in a number of frequency bands K, where K is larger than one.

4. A hearing device according to claim 1 wherein the maximum value LGmax of loop gain is smaller than or equal to 3 dB.

5. A hearing device according to claim 1 wherein the loop gain estimator is configured to estimate said current loop gain $\Delta L(n)$ based only on information about the signal level.

6. A hearing device according to claim 1 wherein the loop gain estimator is configured to estimate said current loop gain $\Delta L(n)$ as $\Delta L(n) = L(n) - L(n - n_D)$, where L(n) is the signal level in dB of a signal of the forward path at the time index n, and $L(n - n_D)$ is the signal level of the same signal one feedback loop earlier, where nD is defined by a loop delay D of said feedback loop.

7. A hearing device according to claim 1 wherein the loop gain estimator is configured to estimate a current loop gain $\Delta L(n)$ within less than three feedback loops after a feedback buildup has started.

8. A hearing device according to claim 1 wherein the loop gain estimator comprises a level estimator for estimating a current level of the electric input signal or another signal of the forward path of the hearing device.

9. A hearing device according to claim 8, wherein the level estimator is configured to operate in a number of frequency bands K, where K is larger than one.

10. A hearing device according to claim 1 wherein the loop gain controller is configured to determine said resulting gain G' according to the following expression $$G'(n) = G(n) - \Delta G(n)$$

where $\Delta G(n)$ is the gain reduction at a given point in time n, wherein the gain reduction is larger than or equal to 0 dB.

11. A hearing device according to claim 10 wherein the loop gain controller is configured to determine said resulting gain G' according to the following expression $$G'(n) = G - \max\left(\frac{\Delta L(n) - LG\max}{a}, 0\right)$$

where the parameter α is used to control the degree of loop gain limitation, and LGmax is a maximum acceptable value of loop gain before gain reduction is initiated.

12. A hearing device according to claim 1 configured to smooth the resulting forward path gain G' over time to provide a smoothed resulting gain G*.

13. A hearing device according to claim 12 comprising a smoothing unit for smoothing the resulting forward path gain G' over time according to the following expression $$G^*(n)=\beta \cdot G'(n)+(1-\beta)\cdot G^*(n-1)$$

where β is a positive parameter.

14. A hearing device according to claim 1 wherein the loop gain estimator is configured to provide a corrected current loop gain estimate ΔL'(n)=ΔL(n)+ΔG(n−1), wherein ΔG(n−1)=G(n−1)−G'(n−1) is the gain reduction one loop delay prior to the current time n, and wherein the loop gain controller is configured to determine said resulting gain G'(n) based on the corrected current loop gain estimate ΔL'(n).

15. A hearing device according to claim 14 wherein the loop gain estimator is configured to multiply the gain reduction ΔG(n−1) one loop delay prior to the current time n with a leaking factor γ, where γ is smaller than 1.

16. A hearing device according to claim 1 wherein the signal processor comprises a combination unit configured to apply said resulting processor gain G'$_P$ to said electric input signal or to a signal originating therefrom.

17. A hearing device according to claim 1 wherein the loop gain controller for dynamically controlling said resulting forward path gain G' is configured to apply a gain reduction ΔG, only if the estimated loop gain is within a given range.

18. A hearing device according to claim 1 being constituted by or comprising a hearing aid.

19. A method of operating a hearing device configured to be worn by a user at or in an ear, the method comprising providing an electric input signal representing sound in the environment of the hearing device, thereby providing an input gain G$_I$, processing said electric input signal, or a signal based thereon, and providing a processed signal, thereby determining a frequency and level dependent desired compressor gain G$_P$ to compensate for a hearing impairment of the user, and a resulting compressor gain G'$_P$, providing output stimuli perceivable as sound for the user based on said processed signal, thereby providing an output gain, G$_O$, a resulting forward path gain G' being defined in a logarithmic representation as G$_I$+G'$_P$+G$_O$, continuously estimating a current loop gain ΔL(n), configured to provide a loop gain estimate within a predefined number of feedback loop delays after a feedback buildup has started, wherein the loop gain estimate is calculated as the current level of a signal of the forward path at time index n minus the level of the same signal one feedback loop earlier, dynamically controlling said resulting forward path gain G' in dependence of said estimate of said current loop gain ΔL(n), limiting a resulting loop gain, LG', defined as a sum of the resulting forward path gain G' and the feedback gain H when given in a logarithmic representation, to stay below a predefined value, and where H is the feedback gain exhibited by the feedback path from an output transducer to an input transducer of the hearing device.

20. A non-transitory computer readable medium storing a computer program comprising instructions which, when the program is executed by a computer, cause the computer to carry out the method of claim 19.

* * * * *